United States Patent
Horiuchi et al.

(10) Patent No.: US 6,800,513 B2
(45) Date of Patent: Oct. 5, 2004

(54) MANUFACTURING SEMICONDUCTOR DEVICE INCLUDING FORMING A BURIED GATE COVERED BY AN INSULATIVE FILM AND A CHANNEL LAYER

(75) Inventors: Masatada Horiuchi, Koganei (JP); Takashi Takahama, Higashimurayama (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/299,793

(22) Filed: Nov. 20, 2002

(65) Prior Publication Data

US 2003/0113961 A1 Jun. 19, 2003

(30) Foreign Application Priority Data

Dec. 14, 2001 (JP) .......................................... 2001-381120

(51) Int. Cl.[7] .......................... H01L 21/00; H01L 21/84; H01L 21/8238
(52) U.S. Cl. ........................ 438/157; 438/217; 438/223; 438/227; 438/232
(58) Field of Search ................................. 438/157, 217, 438/223, 227, 232, 283, 300; 257/347, 354, 372

(56) References Cited

U.S. PATENT DOCUMENTS

| | | | | |
|---|---|---|---|---|
| 5,834,353 A | * | 11/1998 | Wu ............................. | 438/287 |
| 6,043,535 A | * | 3/2000 | Houston ..................... | 257/345 |
| 6,423,599 B1 | * | 7/2002 | Yu ............................. | 438/283 |
| 6,537,890 B2 | * | 3/2003 | Joo et al. .................... | 438/404 |

OTHER PUBLICATIONS

Stanley Wolf Ph.D. and Richard N. Tauber Ph.D. in Silicon Processing for the VLSI Era, vol. 1: Process Technology, Lattice Press, 1986, pp. 175–177.*

* cited by examiner

Primary Examiner—William M. Brewster
(74) Attorney, Agent, or Firm—Antonelli, Terry, Stout & Kraus, LLP

(57) ABSTRACT

A high performance super-miniturized double gate SOI-MOS being fabricated by re-distributing the impurity with high concentration at the interface of a buried gate insulative film and by aligning the double gate in a self-aligned manner and furthermore, by isolating completely the buried gate electrodes electrically from each other,
in which a multi-layered SOI substrate having an amorphous or polycrystal semiconductor layer constituted by way of a buried gate insulative film to a lower portion of an SOI layer is used, ion implantation is applied to the semiconductor layer in a pattern opposite to the upper gate electrode and the buried gate is constituted in a self-alignment relation with the upper gate.

23 Claims, 10 Drawing Sheets

MANUFACTURING SEMICONDUCTOR DEVICE INCLUDING FORMING A BURIED GATE COVERED BY AN INSULATIVE FILM AND A CHANNEL LAYER

BACKGROUND OF THE INVENTION

1. Field of the Invention

This invention concerns a semiconductor integrated circuit device comprising, as a main constituent element, an insulated gate field effect transistor (generally referred to as MOS transistor) capable of operating at low voltage and large current, as well as a manufacturing method thereof. Particularly, it relates to a semiconductor integrated circuit device comprising, as a main constituent element, MOS transistor of a silicon on insulator (referred to as SOI) structure and a manufacturing method thereof.

2. Description of the Related Art

A MOS transistor of an SOI structure (hereinafter referred to as SOI MOS) has generally been known as one of means for reducing the degradation of MOS transistor characteristics along with refinement. As a device structure of a further improved SOI MOS transistor, a double gate SOI MOS shown in FIG. 2 is known and described, for example, in Japanese Patent Laid-Open 2000-208770. That is, the double gate SOI MOS is fabricated by forming a source diffusion layer 110 and a drain diffusion layer 111 in self-alignment with a dummy gate electrode in an SOI layer 105, then forming a trench of a pattern opposite to the dummy gate electrode and forming a buried gate 200 by ion implantation from the trench to the support substrate 1 successively and then selectively burying a metal film such as of W into the trench region to form an upper gate electrode.

As MOS transistor of another SOI structure, MOS transistor of a double gate SOI structure shown in FIG. 3 for the cross sectional structure has also been known. FIG. 3 is an example of a complementary MOS transistor (hereinafter simply referred to as CMOS) in which the left-half shows a P-channel MOS transistor (hereinafter simply referred to as PMOS) region and the right-half shows an N-channel MOS transistor (hereinafter simply referred to as NMOS) region. In the double gate SOIMOS shown in FIG. 3, a device isolation insulative film 101 referred to as LOCOS, a gate insulative film 102 and gate electrodes 103, 104 are previously formed by using a usual Si substrate and then an insulative film 100 of a relatively low softening temperature is deposited on the main surface and the surface is planarized and then bonded with a support substrate 1.

After the wafer bonding step, grinding and chemical mechanical polishing are applied from the rear face of the Si substrate on which the device is formed, to form thin SOI layers 105, 106. In the chemical-mechanical-polishing, the thin SOI layers 105, 106 are left selectively by utilizing the bottom of the device isolation insulative film 101 for stopping of polishing. From this state, after forming second gate electrodes 108, 109 in alignment with gate electrodes 103, 104 to the chemical mechanical polished surface of the thin SOI layers 105, 106 and then source diffusion layers 110, 113 and drain diffusion layers 111, 112 are formed in self-alignment with second gate electrodes 108, 109 according to the known MOS manufacturing technique. In FIG. 3, those portions after the metallization step are omitted for the simplification of explanation.

The double gate SOIMOS has features such as high speed operation characteristics based on low junction parasitic capacitance, complete avoidance of latch-up failure based on complete device isolation, radiation hardness characteristics. Further, since the entire SOI layer functions as a channel by upper and lower gate electrodes, it has a feature capable of minimizing the cut-off current and maximizing the conduction current.

A technique of forming the upper electrode and the buried gate electrode disposed therebelow (impurity layer at high concentration) in self-alignment is disclosed in Japanese Patent Laid-Open No. 2000-208770, which can solve the problem of the pattern shift caused by the bonding method of the prior art. However, no consideration has been taken for increasing the concentration of the impurity sufficiently high at the boundary relative to the buried gate insulative film thereby preventing depletion in the buried gate layer.

Further, in either the bonding method or the oxygen ion implantation method in the double gate SOIMOS of forming by the wafer bonding technique described above, (100) face is usually used for the SOI substrate. This is because the planarity at the bonded boundary is favorable in the former, while the defect recovery characteristics are favorable in the latter. When vertical ion implantation is applied to a support substrate comprising the (100) face by way of the reversed gate pattern trench as shown in FIG. 2, it is extremely difficult to avoid the channeling phenomenon well-known in the implantation method. Implanted ions reach as far as several times a predetermined depth to be reached by the channeling phenomenon to bring about problems of necessary extension of the distribution for the impurity concentration and lowering of the maximum impurity concentration.

Further, in the wafer bonding technique described above, a heat treatment at a temperature of 900° C. or higher is required as a heat treatment after bonding for ensuring adhesion strength after bonding and, usually, a heat treatment at 1100° C. has been adopted. Because of stresses in the wafer bonding step, not uniform pattern shift is caused in the wafer to bring about a problem of making it sometimes impossible for aligning between the lower gate electrodes 103, 104 and the upper gate electrodes 108, 109. Further, in the bonding technique described above, use of the bonding surface as the gate insulative film involves a problem in view of reliability and it has been difficult to reduce the thickness of the SOI film or the buried gate insulative film.

Further, a well structure is generally used for the isolation in the substrate but formation of the well structure on every MOS unit results in increase of occupation area and increase of parasitic capacitance, contrary to the improvement of the performance of MOS. Meanwhile, in the known SOIMOS technique, while an oxide film isolation structure is used instead of the well structure, for example, as described in Japanese Patent Laid-Open Hei 8-130315, it involves a problem that the buried gate electrodes can not be completely isolated electrically from each other.

This invention intends to provide a high performance super-fine double gate SOIMOS in which an impurity is re-distributed at a high concentration on the boundary of a buried gate insulative film and double gates are positioned in a self-alignment manner, and the buried gate electrodes are completely isolated electrically from each other, as well as a manufacturing method thereof.

SUMMARY OF THE INVENTION

This invention is attained by:
(1) a method of manufacturing a semiconductor integrated circuit device comprising;

preparing a wafer in which a first semiconductor layer comprising an amorphous semiconductor or polycrystalline semiconductor, a first insulative film and a second semiconductor area are stacked in this order, forming a second insulative film to a partial region on the main surface of the second semiconductor layer of the wafer including a region to form a gate electrode, forming an impurity layer at high concentration to a region in the first semiconductor layer opposing to the region to form the gate electrode, forming a third insulative film on the second semiconductor layer to the region to form the gate electrode and disposing an upper gate electrode to the region to form the gate electrode on the side of the main surface of the second semiconductor layer by way of the third insulative film;

(2) a method of manufacturing a semiconductor integrated circuit device according to (1) above wherein the impurity layer at high concentration is formed by implanting a desired impurity ions passing through the second insulative layer, the second semiconductor layer and the first insulative layer into the first semiconductor layer to obtain a maximum impurity concentration in the first semiconductor layer;

(3) a method of manufacturing a semiconductor integrated circuit device comprising, placing a wafer comprising a first semiconductor layer, a second insulative film and a second semiconductor layer on a first insulative film formed on a support substrate, forming a third insulative film on the main surface of the second semiconductor layer, depositing an ion implantation stopper film on the third insulative film, disposing an opening to the ion implantation stopper film corresponding to a region to form the gate electrode, passing desired impurity ions in the opening through the third insulative film, the second semiconductor film and the second insulative film thereby forming an impurity diffusion layer comprising impurity at high concentration in the first semiconductor layer, and disposing an upper gate electrode on the side of the main surface of the wafer so as to oppose the impurity diffusion layer; and (4) a method of manufacturing a semiconductor integrated circuit device comprising, disposing a wafer comprising a first semiconductor layer, a second insulative film and a second semiconductor layer on a first insulative film formed on a support substrate, forming a third insulative film on the main surface of the second semiconductor layer, depositing an ion implantation stopper film on the third insulative film, forming an opening reaching the first insulative film to a desired portion of a multi-layered film comprising the ion implantation stopper film, the third insulative film, the second semiconductor layer, the second insulative film and the first semiconductor layer, forming an insulation isolative film in the opening by depositing an insulative film in the opening to a thickness higher than that of the multi-layered film and polishing the insulative film to a desired thickness, introducing an impurity at high concentration to at least a portion of the first semiconductor layer in plural regions insulation isolated from each other by the insulation isolation film, and forming an upper gate electrode on the main surface of the wafer so as to oppose the introduction region of the impurity at high concentration.

As has been described above according to the constitution of this invention, since the diffusion rate of the impurity in an amorphous or polycrystalline semiconductor is much more faster compared with that in single crystals which can attain rapid re-distribution of the impurity and since this is an amorphous or polycrystalline semiconductor, an unexpected extension of the impurity based on the channeling phenomenon of the implanted ions can also be solved substantially, so that a super-fine double gate SOIMOS of high performance can be manufactured.

DETAILED DESCRIPTION OF THE PREFERRED EMBODIMENT

This invention is to be described more in details by way of preferred embodiments. For easier understanding, explanation are made with reference to the drawings in which principal portions are shown in enlarged compared scale with other portions. The material, the conductive type and the process conditions for each of the portions are not restricted to the descriptions of the embodiments and, it will be apparent that various modifications are possible for them.

<Embodiment 1 >

Figure 1:
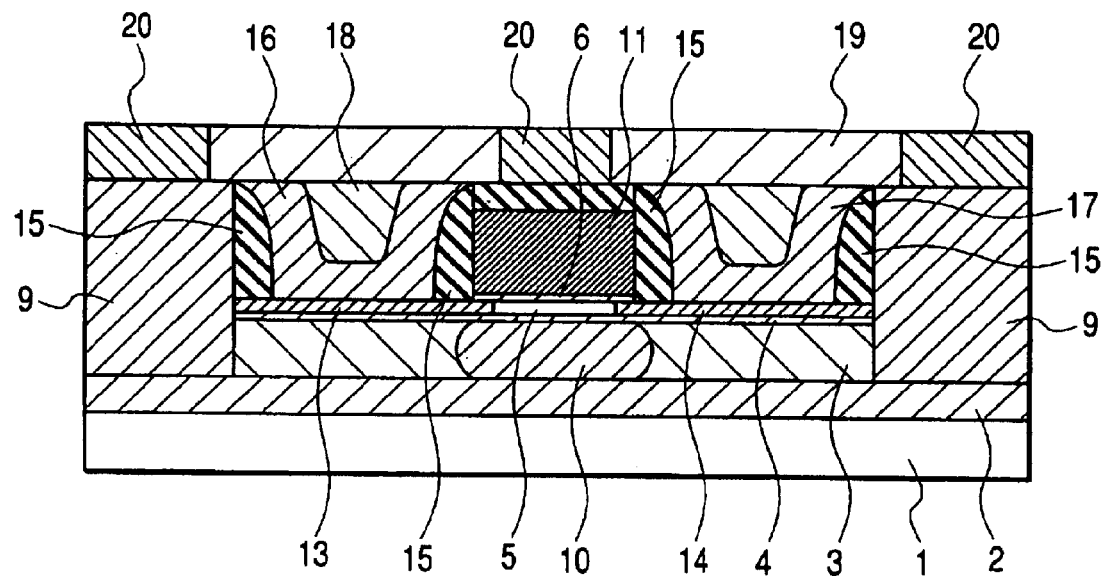
FIG. 1 is a cross sectional view of a completed semiconductor integrated circuit device according to a first embodiment of this invention.
Figure 2:
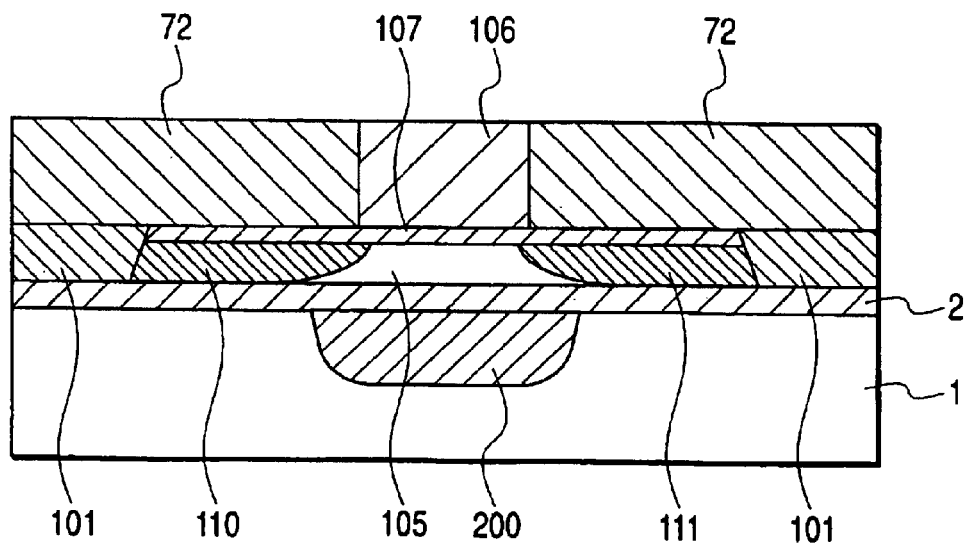
FIG. 2 is a cross sectional view of a conventional double gate MOS field effect transistor.
Figure 3:
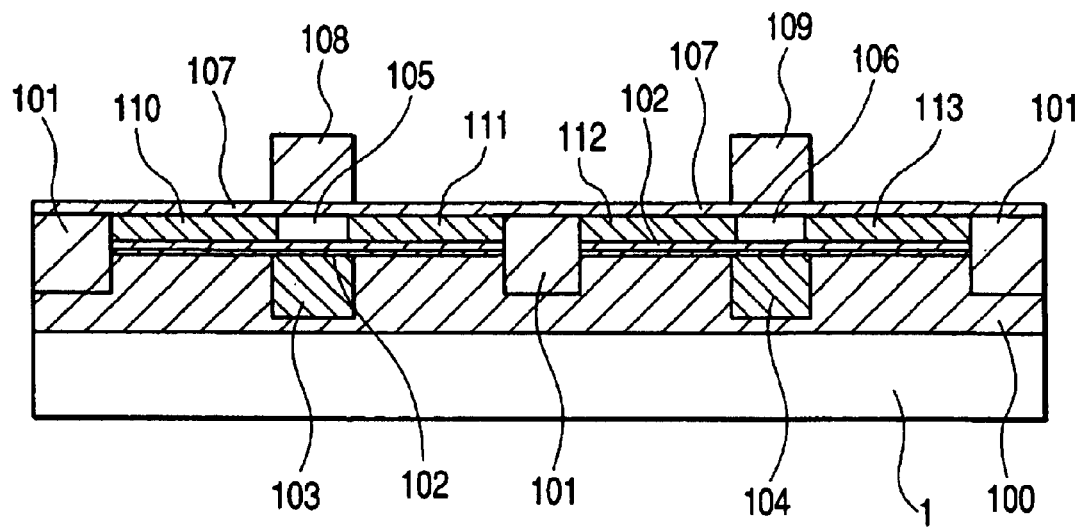
FIG. 3 is a cross sectional view of a conventional double gate SOIMOS field effect transistor.
Figure 4:
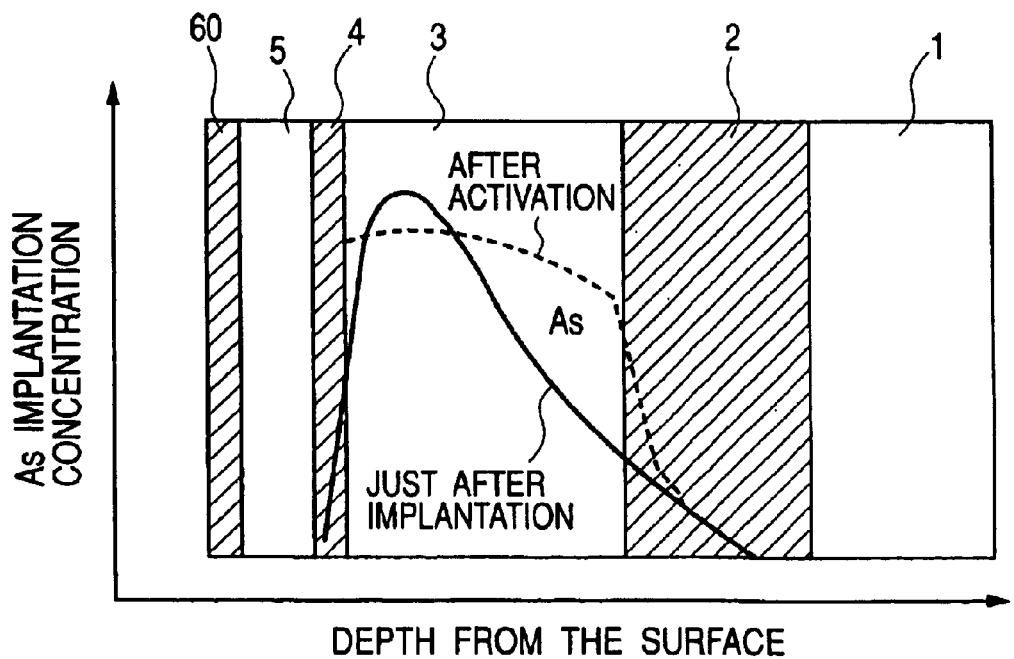
FIG. 4 is a graph for the distribution of ion implanted impurity in the direction of the depth in a buried gate electrode region of a semiconductor integrated circuit device according to the first embodiment of this invention.
Figure 8:
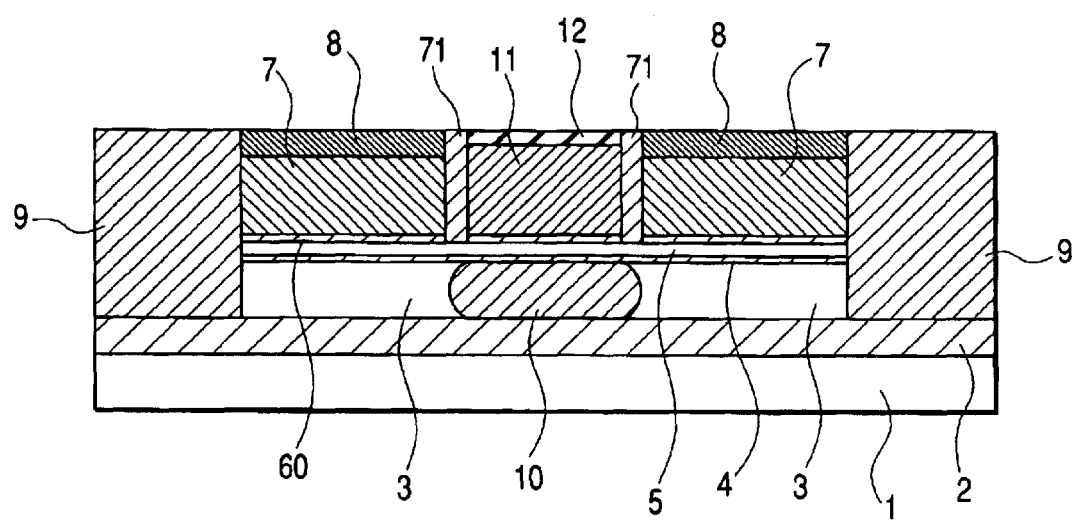
FIG. 8 is a cross sectional view showing a process step of the semiconductor integrated circuit device according to the first embodiment of this invention.
Figure 9:
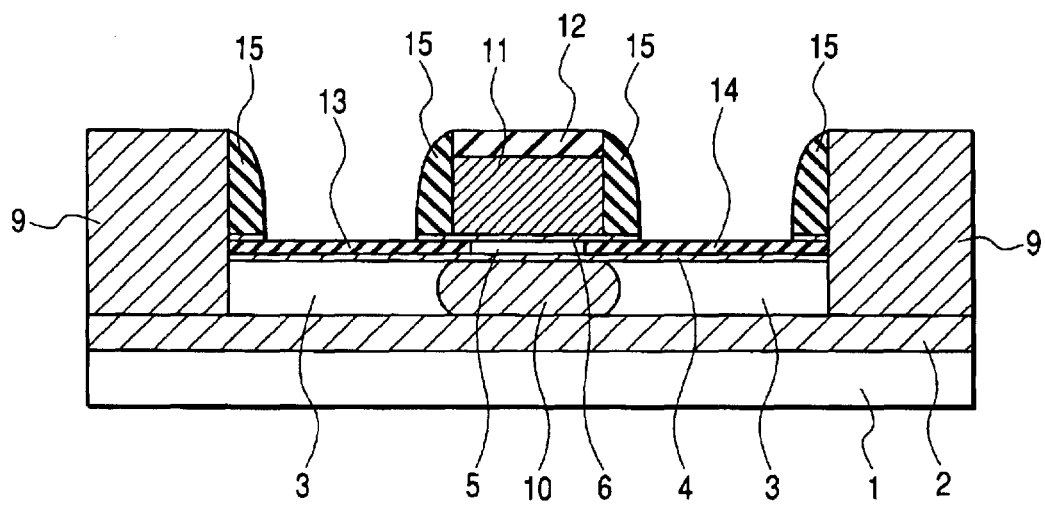
FIG. 9 is a cross sectional view showing a process step of the semiconductor integrated circuit device according to the first embodiment of this invention.
Figure 10:
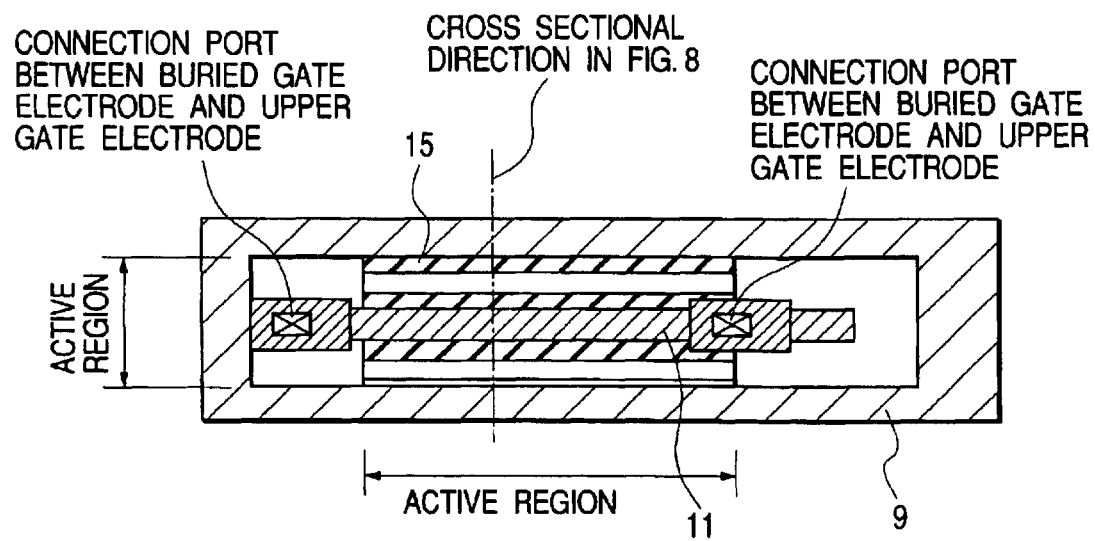
FIG. 10 is a plan view of the semiconductor integrated circuit device according to the first embodiment of this invention in the process step shown in FIG. 8.

FIG. 1 is a cross sectional view of a completed double gate SOIMOS constituting a semiconductor integrated circuit device according to a first embodiment of this invention, FIG. 10 is a plan view in FIG. 9, and FIG. 5 through FIG. 9 are cross sectional views showing the sequence of process steps. An SOI substrate of a multi-layered structure is prepared by successively stacking, on a support substrate 1 of 20 cm diameter comprising Si single crystals, a silicon oxide film 2 of 300 nm thickness, a semiconductor layer 3 of 200 nm thickness, a stacked film 4 comprising a silicon oxide film of 1.8 nm thickness and a silicon nitride film of 0.2 nm thickness formed by nitriding the surface thereof with an NO gas and a P-conductive type single crystal semiconductor layer 5 having 10 Ωcm resistivity with a (100) face direction of 10 nm thickness. The single crystal semiconductor layer 5 is a stacked film comprising single crystal Si or single crystal SiGe or a single crystal Si, and SiGe.

Figure 5:
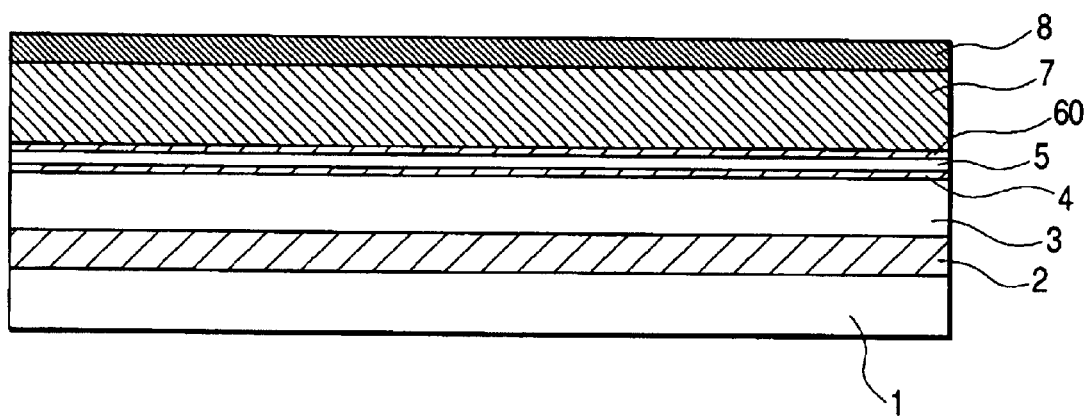
FIG. 5 is a cross sectional view showing a process step of the semiconductor integrated circuit device according to the first embodiment of this invention.

In order to isolate an active region constituting source, drain and channel of a transistor from an active region of an adjacent transistor from each other, the single crystal semiconductor layer 5 is patterned (not illustrated). Then, a stacked insulative film 60 of 5 nm thickness comprising a silicon oxide film and a silicon nitride film is deposited on the surface. The protective film 60 is formed on the surface of the SOI layer 5 before the ion implantation because contaminant impurities driven out by collision on the side wall or the like in the beam passage path are deposited on the wafer in the existent ion implantation apparatus. The film 60 is formed for inhibiting intrusion of the contaminant impurities by the surface passivation film and preventing contamination of the SOI layer 5. Successively, a semiconductor film 7 for mask material of 100 nm thickness, and a silicon nitride film 8 of 50 nm thickness are deposited successively (FIG. 5).

Here, the SOI substrate of the multi-layered film structure is usually prepared by the following procedures. A silicon single crystal wafer is usually used as a supporting substrate, a silicon oxide film 100 to 400 nm thick is formed on the main surface of a supporting substrate by a thermal oxidation method.

Another single crystal substrate having stacked films of an insulative film 4 and an amorphous semiconductor layer 3 on the main surface is prepared.

Then, two single crystal substrate mentioned above are bonded to each other to the main surface thereof.

After the wafer bonding process step, the thickness of the latter single crystal substrate is reduced to form SOI layer 5. The thickness of the SOI layer 5 is controlled favorably by a known technique, for example, of applying hydrogen ion implantation from the surface of the amorphous semiconductor layer 3 so as to attain a maximum projection range in the latter Si single crystal substrate and using the subsequent bonding step and the splitting phenomenon at the maximum projection range interface by a low temperature heat treatment at about 500° C. It has been known that the desired thickness of the SOI layer 5 can be controlled by setting the hydrogen ion implantation energy and that the distribution of the SOI layer thickness in the wafer can be restricted to 2 nm or less. The manufacture for the SOI substrate of the multi-layered structure described above is based on the conventional bonding technique.

As the general specification for the SOI substrate of the multi-layered structure applied to this invention, the thickness of the SOI layer 5 is 20 nm or less and, preferably, about 5 to 10 nm. The thin buried insulative layer 4 is used as the buried gate insulated film in this invention and it desirably has a thickness electrically equivalent with that of the silicon oxide film and about 2 to 1 nm or less, and characteristics capable of inhibiting undesirable impurity diffusion at the usual heat treatment step in the process steps of the semiconductor integrated circuit device according to this invention. That is, it is preferably a silicon nitride film or a stacked film of the silicon nitride film and other insulative film. The material for constituting the stacked film may be an oxide film such as of Si, Al, Ti, Ta, Nb, Zr, Hf or La series rare earth metals and Y, or a silicate film based on the elements described above. The thin buried insulative film 4 can be constituted independently of the existent wafer bonding technique. Accordingly, it can be set at a film thickness corresponding the extremely thin gate insulative film of a ultra-miniaturized MOS, and this is applicable also to a novel subject regarding super miniaturized MOS.

In a case of using an amorphous semiconductor layer 3, the amorphous semiconductor is changed into polycrystal by the heat treatment step after bonding, and the thickness of the semiconductor layer 3 is preferably 10 nm or more and 500 nm or less and, more preferably, about from 100 to 200 nm and it is, preferably, Si or mixed crystal film of Si and Ge. In this invention, the semiconductor layer 3 provides a region to constitute the buried gate electrode and it is a feature of the invention that the layer is not a single crystal semiconductor.

Figure 6:
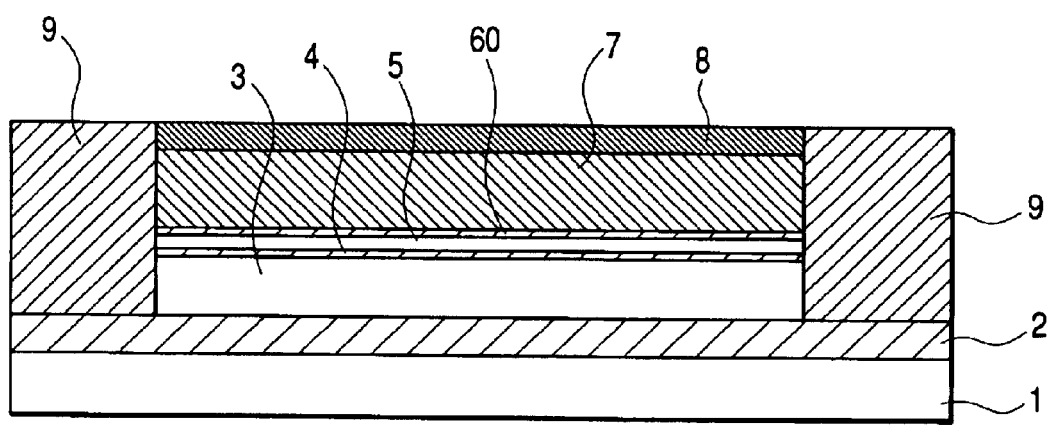
FIG. 6 is a cross sectional view showing a process step of the semiconductor integrated circuit device according to the first embodiment of this invention.

In the semiconductor layer 3 to constitute a buried gate from the state shown in FIG. 5, a trench fabrication was applied to the multi-layered structure film comprising the silicon nitride film 8, the semiconductor film 7 for mask material, the stacked insulative film 60, the single crystal semiconductor layer 5, the stacked film 4, and the semiconductor layer 3 so as to isolate the contact region for the buried gate electrode and the upper gate electrode and the active region described above from the outside. After the trench fabrication, a thick oxide film was deposited over the entire surface so as to completely fill the inside of the trench region and then a thick oxide film is left only in the inside of the trench by chemical mechanical polishing with the upper surface of the silicon nitride film 8 being as an end point for polishing to form a device isolation insulative film 9 (FIG. 6).

From the state shown in FIG. 6, an opening was formed to the semiconductor film 7 for mask material of 100 nm thickness and the silicon nitride film 8 of 50 nm thickness in a pattern opposite to the pattern for the gate electrode to be formed later. The minimum size for the opening width is 70 nm. While the etching end point for the opening is at the stacked insulative film 60, opening may be subsequently applied optionally as far as the surface of the single crystal semiconductor layer 5 and then a thin passivation film may be formed separately on the exposed surface of the single crystal semiconductor layer 5.

A silicon oxide film 71 of 10 nm thickness was deposited and anisotropically dry etched to be left selectively only on the side wall. Successively, As ion implantation and laser irradiation heat treatment were repeated to the opening region by the pattern opposite to the gate electrode. The ion implantation condition for once includes, acceleration energy of 200 KeV and an implantation amount of $1\times10^{14}/cm^2$. The heat treatment was conducted by an XeCl excimer laser irradiation at a wavelength of 308 nm in a He gas atmosphere. The irradiation energy density is 0.05 $J/cm^2$. The accumulated injection amount by the repetition of the ion implantation and laser heat treatment is $2\times10^{15}/cm^2$. In the ion implantation under the conditions described above, the As region at high concentration penetrates the single crystal semiconductor layer 5 of 10 nm thickness to provide a distribution that the maximum impurity concentration depth has about 110 nm depth from the surface of the stacked insulative film 60, that is, having a maximum impurity concentration at the depth of about 90 nm from the surface of the semiconductor layer 3. The maximum impurity concentration in the single crystal semiconductor layer 5 was $1\times10^{20}/cm^3$ or more. In the high concentration ion implantation described above, it is desirable to implant ions having mass as large as possible.

The implanted ion species and the acceleration energy are selected such that implanted ions remain as less as possible inside the SOI layer 5. As has been described above, the ion conforming the purpose desirably has larger mass and Sb or As is preferred for the N-conductive type ion and In is preferred for the P-conductive type ion. However, since the acceptor level of In in Si is apart from the edge of the valence electrode band as 0.16 eV and is less activated electrically, the implanted ions are preferably Sb or As as the N-conductive type ions. In the case of using mixed crystals of Si and Ge for the semiconductor layer 3, difference between the acceptor level and the valence band edge of In decreases along with increase in the ratio of Ge and problems in view of the electrical activation is solved. Accordingly, in a case where the semiconductor layer 3 comprises mixed crystals of Si and Ge, the implanted impurity may be In.

The distribution for the implanted depth of heavy ions shows an asymmetrical profile with respect to the maximum concentration position and it has a distribution which is more moderate than the Gaussian distribution in a region deeper than the maximum concentration position, while more steep in a region shallower than the maximum concentration depth. Accordingly, in a case where the thickness of the single crystal semiconductor layer 5 in the surface region where implanted ions are penetrated is as thin as 10 nm or less, residue of implanted ions in the inside of the single crystal semiconductor layer 5 can be restricted to an extremely small amount. For the reduction of the residue of the implanted ions to the inside of the single crystal semiconductor layer, it is also effective to align the angle of implantation with the crystal axis along which channeling phenomenon develops easily. The ion implantation described above is applied in a direction perpendicular to the (100) face to positively utilize the channeling phenomenon in the inside of the single crystal semiconductor layer 5. For the crystallographical properties of the single crystal semiconductor layer 5 after the implantation of As ions for once, it did not show the amorphous state for a separately prepared sample applied with the identical processing under the observation by a transmission type electron microscope and occurrence of a number of crystal defects was confirmed. However, the crystal defects were not observed after the heat treatment and it was confirmed for the recovery to perfect crystals.

After the ion implantation, the heat treatment by laser irradiation is repeated for the crystal recovery in the single crystal semiconductor layer 5, reduction of the residual As from the single crystal semiconductor layer 5 by external diffusion and, further, activation of As in the semiconductor layer 3. The heat treatment may be applied by other methods, for example, so-called spike annealing, lamp annealing or laser annealing based on other optical source such as YAG laser. Also for the heat treatment ambient, it is not restricted to He and, if necessary, it may be H, Ar or N. In the laser annealing, the irradiation energy density was set to such a condition as not causing rough surface due to the evaporation of single crystal semiconductor layer 5 but it may be optionally adopted a method of introducing an $SiH_4$ gas as an ambient thereby supplying the Si vapor pressure to prevent surface roughening. After the heat treatment described above, a stacked gate insulative film 6 comprising a silicon oxide film of 1.8 nm thickness and a silicon nitride film of 0.2 nm thickness formed by nitriding the surface thereof by an NO gas was formed to the exposed surface of the single crystal semiconductor layer 5 (FIG. 7).

Figure 7:
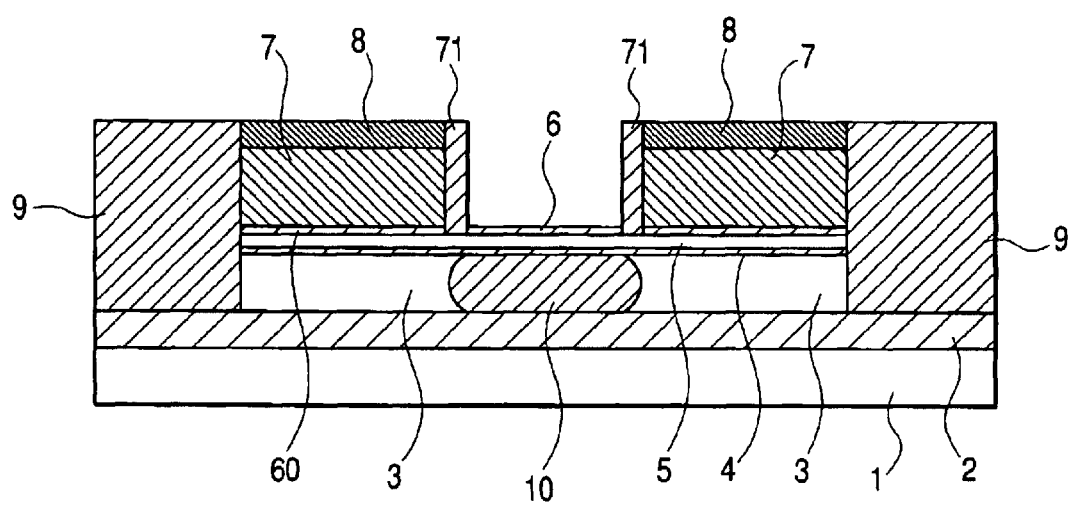
FIG. 7 is a cross sectional view showing a process step of the semiconductor integrated circuit device according to the first embodiment of this invention.

From the state shown in FIG. 7, after forming an opening to the stacked gate insulative film 6 (shown in FIG. 10) on the other than the active region of the semiconductor layer 3 the resistivity of which was lowered by ion implantation, a high concentration B doped Si film was deposited over the entire surface to completely fill the opening. The opening to the stacked gate insulative film 6 is a contact port for the low resistive silicon region 3 as the buried gate electrode to be and the upper gate electrode formed later. After the deposition step of the Si film with addition of B at high concentration, the Si film with addition of B at high concentration on the silicon nitride film 8 was selectively removed by known chemical mechanical polishing with the silicon nitride film 8 being as a polishing stopper film to selectively leave the film only in the opening to form an upper gate electrode 11. Successively, after slightly etching the upper portion of the upper gate electrode 11 anisotropically, the silicon oxide film on the silicon nitride film 8 was selectively removed to be left selectively only to the portion of the upper gate electrode 11 by selective removal of the silicon oxide film on the silicon nitride film 8 by the known chemical and mechanical polishing with the silicon nitride film 8 being as a polishing stopper film to form a gate protection insulative film 12 (FIG. 8).

As the gate electrode material, a refractory-metal or a stacked film of Si and refractory metal is preferred and it may be mixed crystals of Si and Ge. Impurity may be added to Si or mixed crystal of Si and Ge upon film deposition, or may be added by ion implantation after film deposition. After the step of burying back the opening with the gate electrode material, the gate electrode material is left selectively only in the opening described above by chemical mechanical polishing with the upper surface of the ion implantation stopper film formed with the opening being as the end point for polishing.

From the state shown in FIG. 8, the silicon nitride film 8, the silicon film 71 were selectively removed. The upper gate electrode 11 comprising the Si film with addition of B at high concentration is protected by the presence of a silicon oxide film 71. Successively, after removing the silicon oxide film 71, a source diffusion layer 13 and a drain diffusion layer 14 were formed to the exposed single crystal semiconductor layer 5 in self alignment with the upper gate electrode 11 by As ion implantation and known spike annealing. Then, a gate side wall protection insulative film 15 was formed selectively by the entire deposition of the silicon nitride film to 20 nm thickness and anisotropic dry etching thereof. In the step described above, the silicon oxide film 71 may not be removed if desired (FIG. 9).

From the state shown in FIG. 9, an Si film with addition of P at high concentration is deposited, and the deposited Si film other than the regions for the source diffusion layer 13 and the drain diffusion layer 14 was removed selectively by chemical mechanical polishing within the upper portion of the inter-device isolation insulative film 9 being as the polishing stopper mask, to form a stacked source diffusion layer 16 and a stacked drain diffusion layer 17. Then, a thin Co film was deposited over the entire surface by a sputtering method and applied with silicidation by a short time annealing at 500° C. Unreacted Co film was removed by a mixed solution of hydrochloric acid and aqueous hydrogen peroxide to selectively remove the Co silicide film on the stacked source diffusion layer 16 and the stacked drain diffusion layer 17 (not illustrated). From the state, the resistivity of the Co silicide film was decreased by a short time heat treatment at 800° C. Then, after forming a thick silicon oxide deposition film over the entire surface, the surface was planarized by mechanical chemical polishing to form a surface passivation insulative film 20. After forming an opening to a desired region of the surface passivation insulative film, a TiN film as the diffusion barrier material for metalization and a W film as a metalization metal were deposited and the W film was left selectively only to the opening portion by the planarization polishing to form a source electrode 18 and a drain electrode 19. Then, in accordance with a desired circuit constitution, metalization (not illustrated) was formed by deposition and patterning of a metal film comprising aluminum as a main material to manufacture MOS (FIG. 1).

MOS according to this embodiment manufactured by way of the manufacturing steps as described above was compared, in view of characteristics, with SOIMOS of a conventional structure simultaneously manufactured trially under the condition at the same gate length of 50 nm. In a fully depleted type SOIMOS known so far with a SOI layer thickness of 10 nm, the leakage current was as large as $1.3 \times 10^{-5}$ A per 1 $\mu$m of channel width to be in a completely punch through state at a supplied power voltage of 1.0 V and under the condition of the gate voltage of 0 V. The on-current value at the gate voltage of 1.0 V was 0.74 mA per 1 $\mu$m of channel width under the punch through condition. On the other hand, in SOIMOS according to this embodiment with the SOI layer thickness of 10 nm, the current leakage at a power supply voltage of 1.0 V and under the condition of a gate voltage of 0 V was as small as $2.4 \times 10^{-8}$ A per 1 $\mu$m of channel width, and a substantially twice current value, that is, 1.42 mA per 1 $\mu$m of channel width could be obtained at a gate voltage of 1.0 V. In this embodiment, when the thickness of the Si layer 5 is increased to 20 nm, while the current value at the gate voltage of 1.0 V could be increased, the leakage current increased as well. Accordingly, it is desirable to set the thickness of the SOI layer relative to the gate length to ¼ or less in order to suppress the leakage current to $1 \times 10^{-7}$ A or less.

In the N-channel MOS transistor (hereinafter simply referred to as NMOS) according to this embodiment, the gate electrode 10 was N-conductive type and the upper gate electrode 11 was P-conductive type. However, the upper gate electrode 11 may be constituted also with a metal material, for example, W having the work function near the center of the Si forbidden band. Further, no substantial difference is caused for the obtained characteristics even when they are manufacturing in a reversed manner such as forming the buried gate electrode 10 to P-conductive type and the upper gate electrode 11 to N-conductive type. In SOIMOS manufactured by constituting the buried gate electrode 10 with N-conductive type and the upper gate electrode 11 with W and in accordance with the embodiment described above for other steps, when the thickness of the SOI film was decreased to 5 nm, the current value could be increased as 2.01 mA per 1 $\mu$m of channel width at a supplied power voltage of 1.0 V and under the condition of the gate voltage of 1.0 V, although the current leakage under the condition at the gate voltage of 0 V was somewhat large as $6.8 \times 10^{-7}$ A. The characteristics described above is based on that the threshold voltage value was set to a negative value but this does not means a punch through state. If the thickness of the SOI layer is 10 nm or more, the leakage current increases further.

For the convenience of explanation, this embodiment has been described to a case of NMOS, but P-channel MOS transistor (hereinafter simply referred to as PMOS) in which the conductive type for all components is reversed can be manufactured in the same manner and which can provide characteristics of less leakage current and large driving current value which could not be obtained in accordance with the known SOIMOS. This is because the gate electrode and the upper gate electrode can be constituted in a self-alignment relation based on this embodiment, by which SOIMOS of double gate structure can be attained with a super-miniaturized gate size.

In this embodiment, the buried gate electrode 10 and the upper gate electrode 11 were connected at both ends of the active region as shown in FIG. 10. Since the resistivity of the buried gate electrode 10 is constituted with Si in the connection at one position, the resistance value is no more negligible in the miniaturized gate structure, so that the modification is applied for moderating this. Accordingly, depending on the circuits to be applied, the occupation area may be decreased by applying connection for the buried gate electrode 10 and the upper gate electrode 11 only at one position.

<Embodiment 2>

Figure 11:
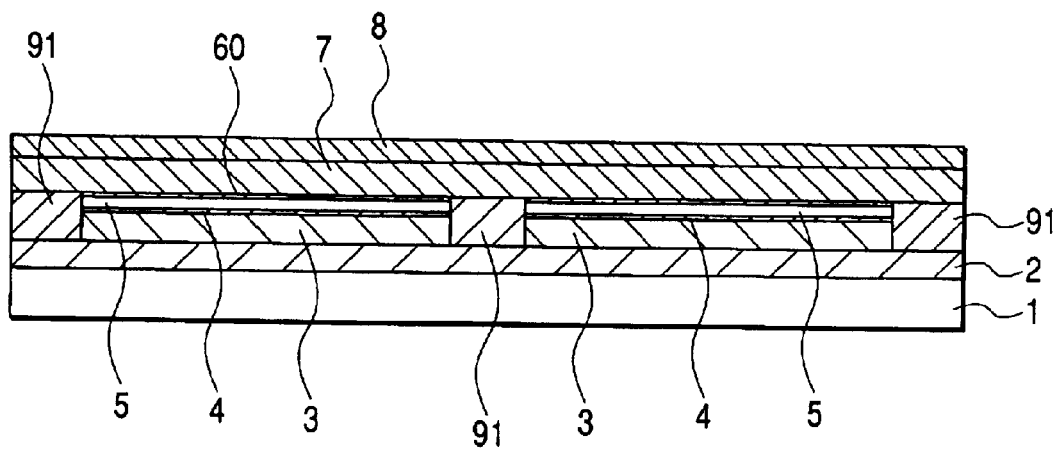
FIG. 11 is a cross sectional view showing a process step of a semiconductor integrated circuit device according to a second embodiment of this invention.
Figure 14:
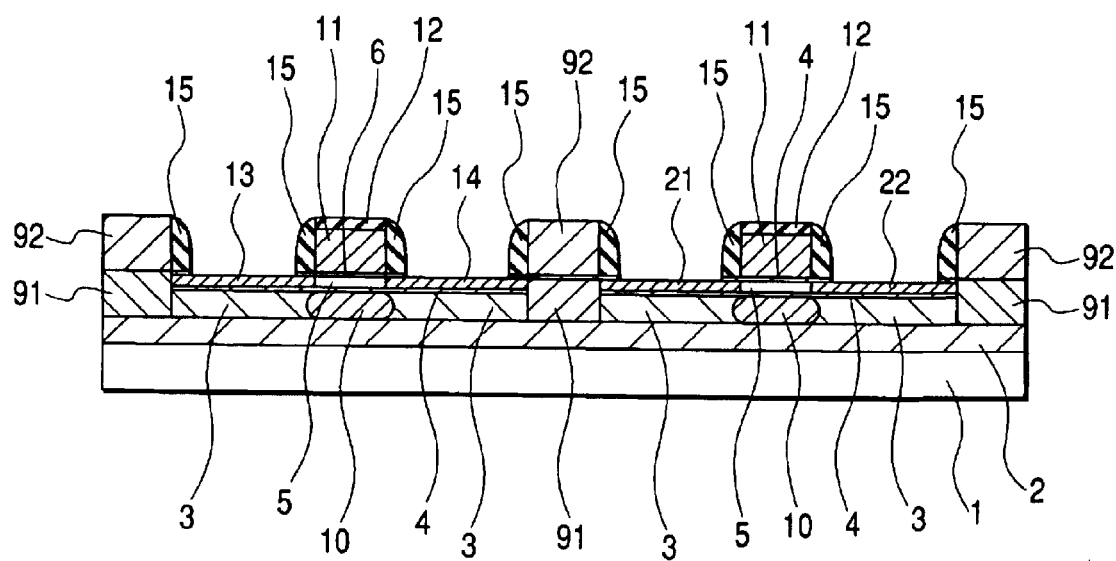
FIG. 14 is a cross sectional view showing a process step of the semiconductor integrated circuit device according to the second embodiment of this invention.
Figure 15:
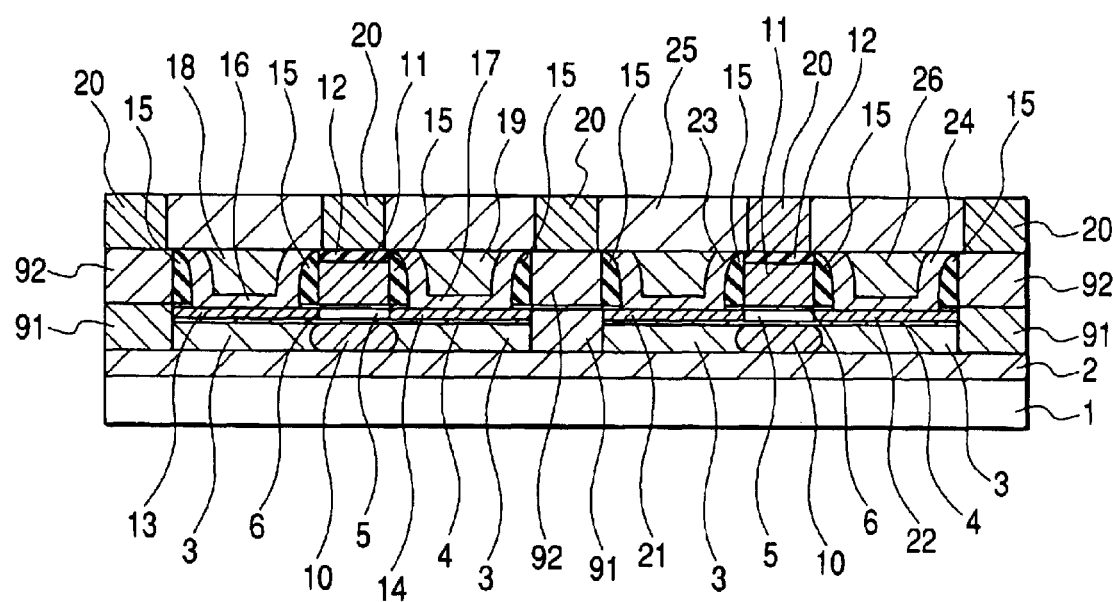
FIG. 15 is a cross sectional view of a completed semiconductor integrated circuit device according to the second embodiment of this invention.
Figure 16:
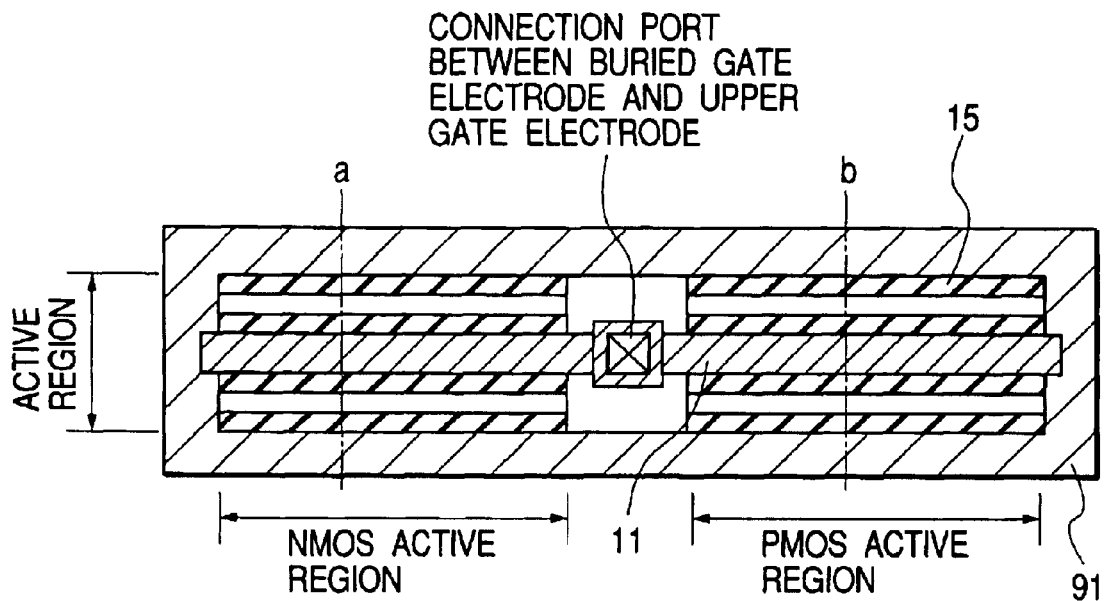
FIG. 16 is a plan view of the semiconductor integrated circuit device according to the second embodiment of this invention in the process step shown in FIG. 13.

FIG. 15 is a cross sectional view for a completed double gate SOIMOS constituting a semiconductor integrated circuit device according to the second embodiment of the invention. FIG. 16 is a plan view in FIG. 14 and FIG. 11 through FIG. 14 are cross sectional views showing the procedures for process steps. Characters a, b in FIG. 16 are cut lines for showing the cross section for the portions of NMOS and PMOS in FIG. 14 in which the portions for NMOS and PMOS are illustrated as if they are in a contiguous structure for the sake of explanation. An SOI substrate of multi-layered structure of the same specification as that used in Embodiment 1 was prepared. The substrate was patterned for defining active regions of the single crystal semiconductor layer 5 for NMOS and PMOS (refer to plan view of FIG. 16). Then, after forming the inter-device isolation trench with the silicon oxide film 2 as a bottom and depositing a silicon oxide film so as to fill the inside of the trench, known chemical mechanical polishing was applied to selectively leave the silicon film only in the trench to form a inter-device isolation insulative film 91. Then, a stacked insulative film 60 of 5 nm thickness comprising a silicon oxide film and a silicon nitride film was deposited on the surface and, successively, a semiconductor film 7 for mask material of 100 nm thickness and a silicon nitride film 8 of 50 nm thickness were successively deposited (FIG. 11).

From the state shown in FIG. 11, an opening was formed to the semiconductor film 7 for mask material of 100 nm thickness and the silicon nitride film 8 of 50 nm thickness with the pattern reverse to the pattern of the upper gate electrode to be formed later. The minimum size for the opening width is 50 nm. While the end point for the etching of the opening is at the stacked insulative film 60, the opening may be formed optionally as far as the single crystal semiconductor layer 5 and then a thin passivation film may also be formed separately to the exposed single crystal semiconductor layer 5 (FIG. 12).

Figure 12:
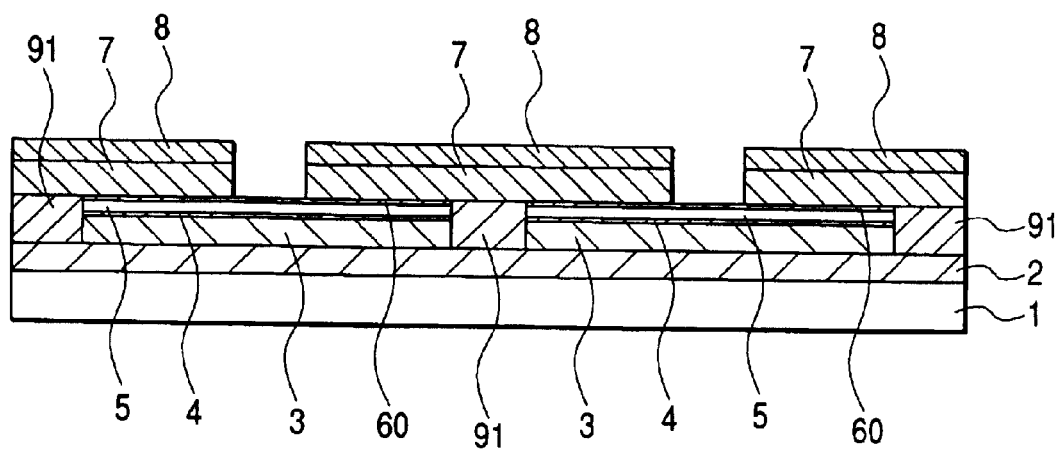
FIG. 12 is a cross sectional view showing a process step of the semiconductor integrated circuit device according to the second embodiment of this invention.

From the state shown FIG. 12, a silicon oxide film 71 of 5 nm thickness was deposited and anisotropically dry etched to be selectively left only on the side wall. Successively, ion implantation of an N-conductive type impurity at a medium concentration and laser irradiation heat treatment were repeated to the opening region with a pattern opposite to that of the gate electrode in accordance with Embodiment 1 to form a low resistive silicon region 10. While As was used as the implantation ion species in the embodiment described above, Sb was used in this embodiment. The ion implantation is not restricted to the ion implantation at the medium concentration but it may be done by ion implantation at high concentration collectively by the injection amount about from $1\times10^{15}$ to $2\times10^{15}/cm^2$. After repeating the ion implantation and the laser irradiation short time annealing, the exposed stacked insulative film 60 was removed selectively and then a stacked film comprising a silicon oxide film of 1.8 nm and a silicon nitride film of 0.2 nm formed by nitriding the surface thereof with an NO gas was formed as a stacked gate insulative film 6. After forming the opening to the stacked insulative film 6, (shown in FIG. 16) on the region of the semiconductor layer 3 other than the active region lowered for the resistivity by ion implantation, an Si film with addition of B at high concentration was deposited over the entire surface to fill the opening completely. The opening to the stacked gate insulative film is a junction port between the region of a low resistive silicon film 10 and an upper electrode to be formed later. After the deposition step for the Si film with addition of B at high concentration, the Si film with addition of B at high concentration on the silicon nitride film 8 was selectively removed by a known chemical mechanical polishing with the silicon nitride film being as a polishing stopper film to be left selectively only in the opening as an upper gate electrode. Successively, after slightly etching the upper portion of the upper electrode isotropically, a silicon oxide film was deposited and the silicon oxide film on the silicon nitride film 8 was selectively removed by known chemical mechanical polishing to be left selectively only at the portion for the upper gate electrode 11 with the silicon nitride film 8 being as a polishing stopper film to form a gate protection insulative film (FIG. 13).

Figure 13:
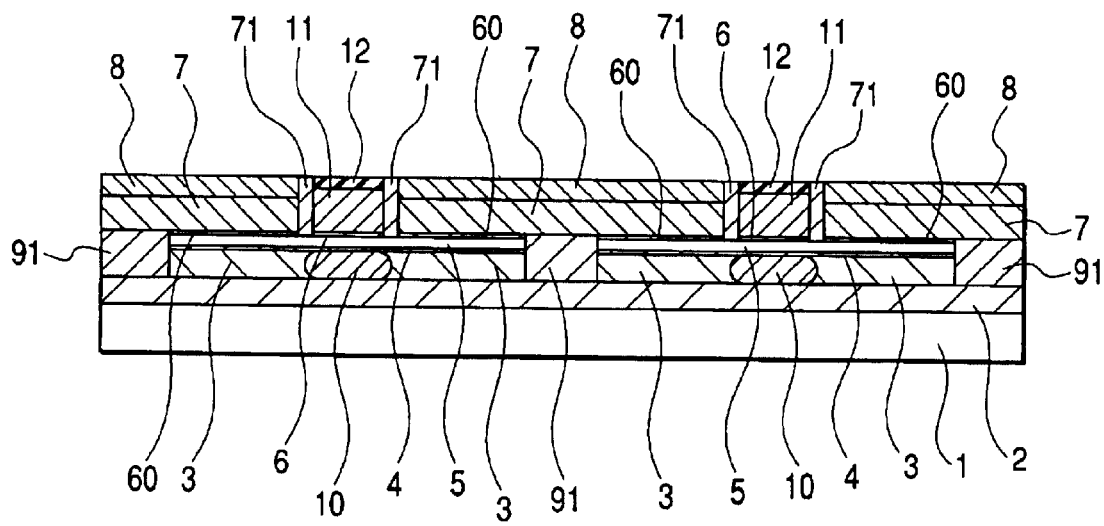
FIG. 13 is a cross sectional view showing process step of the semiconductor integrated circuit device according to the second embodiment of this invention.

From the state shown in FIG. 13, after selectively removing the silicon nitride film 8 and the semiconductor film 7 for mask material, a dummy gate 91 of a silicon oxide film was formed on an inter-layer isolation region by using a known self-alignment contact method. The upper gate electrode 11 comprising a Si film with doping of B at high concentration is protected by the presence of the silicon oxide film 71. Successively, after removing the silicon oxide film 71, As ion was implanted to the NMOS region while B was ion implanted to the PMOS region selectively, a high concentration N-conductive type source diffusion layer 13, a high concentration N-conductive type drain diffusion layer 14, and a high concentration P-conductive type source diffusion layer 21, a high concentration P-conductive type drain diffusion layer 22 were formed respectively to the exposed single crystal semiconductor layer 5 in a self alignment relation with the upper gate electrode 11 and followed by a known spike annealing. Then, a gate side wall protection insulative film 15 was formed selectivity by entire deposition of a silicon nitride film at 20 nm thickness and anisotropical dry etching thereof. In the step described above, the silicon oxide film 71 may not be removed if desired (FIG. 14).

From the state shown FIG. 14, a high concentration N-conductive type stacked source diffusion layer 16, a high concentration N-conductive type stacked source diffusion layer 17 and, further, a high concentration P-conductive type stacked source diffusion layer 24 and a high concentration P-conductive type stacked source diffusion layer 23 were formed in accordance with Embodiment 1. Impurities were added based on selective ion implantation at high concentration of As and B to NMOS and PMOS regions respectively. Then, a Co film was deposited thinly over the entire surface by the sputtering method and applied with silicidation by short time annealing at 500° C. Unreacted Co film was removed by a mixed solution of hydrochloric acid and aqueous hydrogen peroxide to leave the Co silicide film on the stacked source diffusion layers 16 and 24, and stacked drain diffusion layers 17 and 23 selectively (not illustrated). From this state, the Co silicide film was lowered for the resistivity by a short time heat treatment at 800° C. Then, after forming a thick silicon oxide deposition film over the entire surface, the surface is planarized by mechanical and chemical polishing to form a surface protection insulative film 20.

After applying an opening to a desired region of a surface protection insulative film, a TiN film as the diffusion barrier material for the meatllization metal and a W film as meatllization metals were deposited and the W film was selectively left only at the opening portion by the planarizing polishing to form source electrodes 18, 26 and drain electrodes 19, 25. Subsequently, meatllization was formed by deposition of a metal film using aluminum as a main material and patterning in accordance with the desired circuit constitution, to form interconnect metallization (not illustrated) and manufacture a CMOS (FIG. 15).

CMOS According to this embodiment manufacture by way of the process steps described above was compared with a fully depleted type SOICMOS under the condition of an identical gate length of 50 nm. NMOS in CMOS according to this embodiment showed identical characteristics with those of the previous embodiment and sufficiently small leakage current and large driving current characteristics could be attained. In PMOS, the leakage current was as small as $2.7\times10^{-9}$ A per 1 $\mu$m of channel width at a supplied power voltage of 1.0 V and under the condition of a gate voltage of 0 V, and a large driving current of 0.73 mA per 1 $\mu$m of channel width could be attained at a gate voltage of 1.0 V. In PMOS with a gate length of 45 nm, a leaking current was $1.1\times10^{-8}$ A and a current value was 0.80 mA per 1 $\mu$m of channel width at a gate voltage of 1.0 V, and driving current characteristics of more than the PMOS of fully depleted type SOINMOS of an existent structure and twice or more of PMOS could be obtained without increasing the leakage current.

In CMOS of this embodiment, the buried gate electrode 10 was N-conductive type and the upper gate electrode 11 was P-conductive type in any of PMOS and NMOS and the gates for PMOS and NMOS were formed in one identical step. This shows the effect of decreasing the number of process steps and shows that CMOS can be manufactured at a reduced cost contrary to the conventional CMOS in which conductive type of the gate electrode had to be different between PMOS and NMOS for the threshold voltage control. In this embodiment, when PMOS in which the upper gate electrode 1 was constituted with W was also manufactured trially and the characteristics were evaluated in the same manner as in NMOS of Embodiment 1, the driving current was about ⅓ compared with PMOS of this embodiment having the P-conductive type upper gate electrode structure, that is, the leakage current was $1\times10^{-13}$ A or less and the driving current value at the gate voltage of 1.0 V was 0.25 mA per 1 $\mu$m of channel width for the gate length of 50 nm and the leakage current was $1\times10^{-13}$ A or less and the driving current value at the gate voltage of 1.0 V was 0.37 mA per 1 $\mu$m of the channel width for the device with the gate length of 30 nm. This is due to that the threshold voltage for PMOS was set higher in the W upper gate electrode constitution. In NMOS of the W upper gate electrode constitution, the threshold voltage is excessively low, while in PMOS, the threshold voltage is excessively high and improvement for the characteristics as CMOS is inferior compared with the constitution of the P-conductive type upper gate electrode is deteriorated. However, they may be designed depending on the application use of the semiconductor integrated circuit to be applied In this embodiment, each of the buried gate electrodes 10 and the upper gate electrodes 11 for the PMOS and NMOS constituting CMOS as shown in the plan view during manufacturing steps in FIG. 16 are connected in the inactive region placed between each of the active regions for PMOS and NMOS. The connection region is a region which was used also in conventional CMOS as the region for connecting as the input terminal with external connection, and occupation area is not increased even when the region is used for the connection between the buried gate electrode 10 and the upper gate electrode 11. That is, CMOS of large current and low leakage current characteristics based on the double gate structure of the same occupation area with that of conventional CMOS can be attained.

<Embodiment 3>

After As implantation step of forming the low resistive silicon region 10 at high concentration amount of about $1 \times 10^{15}$ to $2 \times 10^{15}/cm^2$, in Embodiment 1, In ion implantation was carried out successively. As the In ion implantation condition, the acceleration energy was at 60 KeV and the implantation dose was $8 \times 10^{12}/cm^2$ such that they are close to the stacked film 4 and reached a maximum concentration in the semiconductor layer 3. By the ion implantation under the conditions described above, In ion reached a maximum impurity concentration of $4 \times 10^{18}/cm^3$ at a position for depth of 10 nm from the boundary of the stacked film 4 in the semiconductor layer 3. In ion remains at a maximum concentration of about $2 \times 10^{17}/cm^3$ on the side of the boundary of the single crystal semiconductor layer 5 and the stacked film 4 and this acts to compensate As ion in the single crystal semiconductor layer 5. After applying ion implantation to form the low resistive silicon region 10, a semiconductor integrated circuit device was manufactured in accordance with the process steps of Embodiment 1.

AS ion depth profile in the low resistive silicon region 10 after the final manufacturing step is evaluated by a secondary ion mass spectroscopy, the depth for the maximum impurity concentration shifts near the boundary of the stacked film 4 so as to overlap with the In distribution, which reduces depletion near the boundary of buried gate insulation film in the buried gate electrode 10, and the gate electric field of the double gate structure can be applied more effectively compared with MOS according to Embodiment 1.

Thus, characteristics of larger driving current and less leakage current could be attained compared with Embodiment 1, as the leakage current of $2 \times 10^{-7}$ A per 1 μm of channel width under the condition at the gate voltage of 0 V, and a driving current value of 2.2 mA per 1 μm of channel width at gate voltage of 1.0 V.

Near the boundary of the stacked film 4 for the single crystal semiconductor layer 5 of MOS manufactured under the conditions of this embodiment As remains inevitably to make the threshold voltage value negative and result in increase of the leakage current, but In also localizes near the boundary for the stacked film 4 of the single crystal semiconductor layer 5 to compensate the residual effect of As. This can eventually prevent undesired lowering of the threshold voltage value.

In this invention, a second impurity having a phenomenon of attracting the impurity for promoting the re-distribution of the impurity further to the boundary of the buried gate insulative film is separately introduced near the boundary of the buried gate insulative film. As the second impurity, In was used for example in this invention. It has been found that In shows an effect of attracting the impurity such as As by two order of magnitude or more and the new phenomenon was applied to suppress the depletion of the buried gate electrode thereby enabling application to super-miniaturized MOS.

It is considered that the effect of this embodiment is due to the effect of implanted In to attract and diffuse As and identical phenomenon can be found also with the ion implantation of F or H at high concentration. Accordingly, the ion implantation step for In in this embodiment may be replaced also for high concentration ion implantation of F or H with no problem.

<Embodiment 4>

In Embodiments 1 to 3 described above, the prepared stacked SOI substrate of multi-layered structure comprised, on the support substrate 1, a silicon oxide film 2 of 300 nm thickness, a semiconductor layer 3 of 200 nm thickness, a stacked film 4 of silicon oxide film of 1.8 nm thickness and a silicon nitride film of 0.2 nm thickness formed by nitriding the surface thereof with an NO gas, and a P-conductive type single crystal semiconductor layer 5 having 10 Ωcm with (100) face direction of 10 nm thickness. In this embodiment, an $Si_{0.8}Ge_{0.2}$ mixed crystal film 3 in which Ge is incorporated by 20% was used in place of the semiconductor layer 3 and a semiconductor integrated circuit device was manufactured in accordance with Embodiment 3. The mixing ratio of Ge may be within such a stress range as not causing crystal defects in the upper silicon film and is not restricted to 20%. In the process steps of this embodiment, the low resistance $Si_{0.8}Ge_{0.2}$ mixed crystal film with addition of B at high concentration was deposited, instead of the Si film with addition of B at high concentration to be deposited from the state shown in FIG. 7, by a chemical vapor deposition reaction and then a semiconductor integrated circuit device was manufactured by process steps in accordance with Embodiment 1.

In the MOS device for constituting the semiconductor integrated circuit device manufactured according to this embodiment, the low resistive region constituting the buried gate is further decreased for the resistivity compared with the Si film and, further, resistivity was decreased also in the upper gate electrode 11. Thus, the operation speed could be made higher compared with the transistor according to Embodiment 1 by the reduction of the resistance·capacitance product at the gate electrode. In this embodiment, also the upper gate electrode 11 was comprised of SiGe mixed crystals, but the upper gate electrode may be a low resistive Si film like that in Embodiment 1.

<Embodiment 5>

A metal film comprising W as the upper gate electrode 11 was deposited from the state shown in FIG. 7 by a sputtering method in Embodiment 1 and then a semiconductor integrated circuit device was manufactured in the order of the process steps according to the manufacturing steps of Embodiment 1.

In the MOS device for constituting the semiconductor integrated circuit device manufactured according to this embodiment, while the threshold voltage value was decreased by about 0.2 V compared with MOS according to Embodiment 1, it was confirmed that the device could be operated satisfactorily with no punch through even at a gate length of 50 nm. The maximum current was 2.05 mA per 1 μm of channel width at 1 V of a supplied power voltage in a device of 50 nm gate length, and a larger driving current of 1.4 times compared with MOS according to Embodiment 1 could be attained. In this embodiment, W shown as an example for the upper gate electrode 11 may be replaced with a metal or metal compound such as TiN, Al, Ti, Pt, Ir, WN, Mo, Co, Ta, TaN and Ru.

<Embodiment 6>

A semiconductor integrated circuit device was manufactured by using P-conductive type B or In instead of N-conductive type as the ion implantation species constituting the buried gate electrode 10 in Embodiment 5, and using SiGe mixed crystals with addition of Ge at about 10% for the semiconductor layer 3 in Embodiment 5, and in accordance with Embodiment 5 for other manufacturing steps.

When the MOS device constituting the semiconductor integrated circuit device according to this embodiment was when compared, for the characteristics, with MOS according to Embodiment 5 of an identical gate size with the gate length of 50 nm, while the maximum driving current was somewhat inferior as 1.7 mA per 1 μm of channel width at a 1 V of supplied power source voltage, the threshold voltage value was increased by about 0.2 V and the leakage current per 1 μm for channel width could be decreased by one order of magnitude or more, as 50 nA, and characteristics of less power consumption and larger driving current could be attained.

<Embodiment 7>

Figure 17:
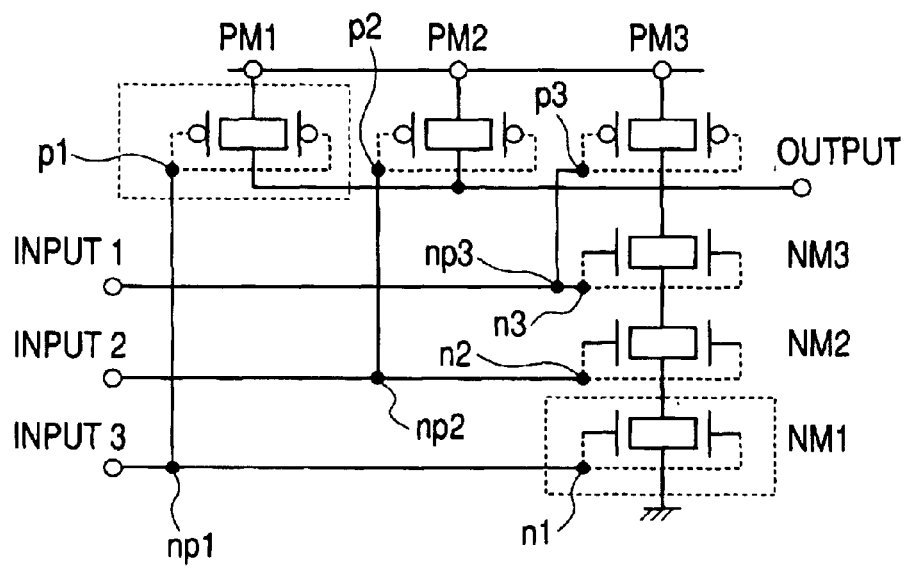
FIG. 17 is a constitutional circuit diagram of a semiconductor integrated circuit device according to a seventh embodiment of this invention.
Figure 18:
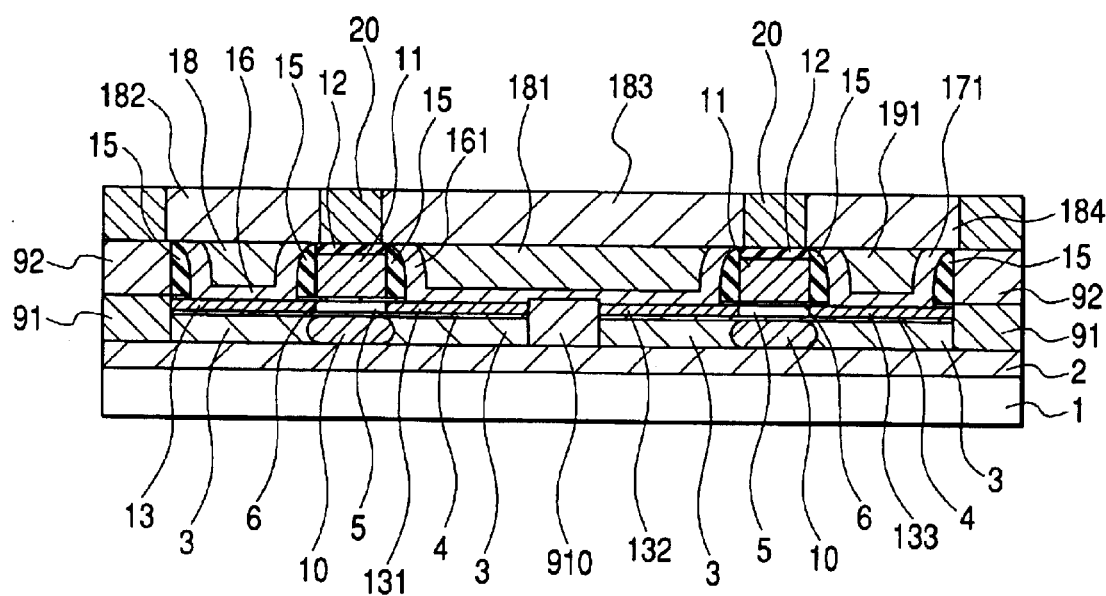
FIG. 18 is a cross sectional view for a portion of completed serially connected transistors in the semiconductor integrated circuit device according to the seventh embodiment of this invention.

FIG. 17 is a NAND logic circuit diagram showing a constitution of a semiconductor integrated circuit device according to a seventh embodiment of the invention and FIG. 18 is a cross sectional view for completed portions of serially connected transistors NM2 and NM2 in FIG. 17. This embodiment is an example where this invention is applied to a logic circuit referred to as 3-input NAND. In the 3-input NAND logic circuit, double gate structure SOINMOS NM1, NM2 and NM3 by the number of three, are serially connected corresponding to input signal terminals, input 1, input 2 and input 3 and double gate structure SOIPMOS PM1, PM2 and PM3 by the number of three are connected in parallel. Each of the NMOS and PMOS was manufactured by the manufacturing steps basically in accordance with Embodiment 2. In the NAND logic circuit, the input terminals have to be isolated from each other. Accordingly, constitutions isolated from each other is required between each of the buried gate electrodes in this embodiment. For satisfying the requirements described above and enabling serial connection for NMOS, in this embodiment, device isolation insulative films 91, 910 with the silicon oxide film 2 being as the bottom were formed according to the manufacturing steps in Embodiment described above and the subsequent manufacturing steps were also carried out in accordance with Embodiment 2. In the manufacturing steps for the highly concentrated N-conductive type stacked source diffusion layer 16 and the highly concentrated N-conductive type stacked drain diffusion layer 17, the device isolation insulative film 92 is previously patterned such that the drain diffusion layer for NM1 and the source diffusion layer for NM2 are connected. Subsequently, the low resistive Si film was removed by selective polishing in accordance with Embodiment 2 to form a stacked source/drain diffusion layer 161, a stacked source drain layer 16, and a stacked drain diffusion layer 171. Then, the semiconductor integrated circuit device of this embodiment was manufactured in accordance with Embodiment 2 for the subsequent manufacturing steps.

In the semiconductor integrated circuit device according to this embodiment, a super minituarized circuit of large driving current and small leakage current can be attained also for NAND circuit which is a typical logic circuit to enable super-high speed operatable logic. While this embodiment concerns serial connection of NMOS, the serial connection can be attained in accordance with a quite identical idea also for PMOS. Accordingly, this embodiment is applicable not only to the NAND circuit but also to other logic circuits, that is, logic circuits such as NOR, OR, AND, EXOR and EXNOR. Further, it is applicable also to static RAM (Random Access Memory) or dynamic RAM and, further, a non-volatile memory such as flush memory and also to semiconductor integrated circuit devices in which such memories are hybridized.

According to this invention, since the buried gate electrode can be formed as an impurity region at high concentration, the upper gate electrode and the buried gate electrode can be formed in self-alignment manner and the buried gate electrodes between each of the devices can be isolated more completely by the insulative film, it can provide an effect capable of manufacturing a double gate SOIMOS having a high speed operatable characteristic based on the reduced junction parasitic capacitance and suppressed latch-up based on complete inter-device isolation.

What is claimed is:

1. A method of manufacturing a semiconductor integrated circuit device comprising:

preparing a wafer in which a first semiconductor layer comprising an amorphous semiconductor or polycrystal semiconductor, a first insulative film and a second semiconductor layer are stacked in this order, forming a second insulative film at a partial region on a main surface of the second semiconductor layer of the wafer including a region to be formed with a gate electrode, forming an impurity layer at high concentration in a region in the first semiconductor layer opposing to the region to be formed with the gate electrode, forming a third insulative film on the second semiconductor layer at the region to be formed the gate electrode and disposing an upper gate electrode on the region to form the gate electrode above the main surface of the second semiconductor layer in contact with the third insulative film, wherein the impurity layer at high concentration is formed by implanting desired impurity ions passing through the second insulative layer, the second semiconductor layer and the first insulative layer into the first semiconductor layer to obtain a maximum impurity concentration in the first semiconductor layer.

2. A method of manufacturing a semiconductor integrated circuit device according to claim 1, wherein the impurity ions are As or Sb.

3. A method of manufacturing a semiconductor integrated circuit device according to claim 2, wherein the method comprises a step of implanting the impurity of In, F or H to the first semiconductor layer in which impurity of As or Sb has been implanted.

4. A method of manufacturing a semiconductor integrated circuit device according to claim 1, wherein the maximum impurity concentration in the first semiconductor layer is $1 \times 10^{20}/cm^3$ or more.

5. A method of manufacturing a semiconductor integrated circuit device according to claim 1, wherein the method comprises a step of applying an impurity implantation step and a heat treatment step repetitively to the first semiconductor layer in that the cumulative implanted impurity in the first semiconductor layer is $1 \times 10^{15}/cm^2$ or more.

6. A method of manufacturing a semiconductor integrated circuit device according to claim 1, wherein the second semiconductor layer is comprised of a single crystal Si film, a single crystal SiGe film or a stacked film of a single crystal Si film and a single crystal SiGe film.

7. A method of manufacturing a semiconductor integrated circuit device according to claim 1, wherein the second insulative film is comprised of a silicon nitride film or a stacked film of a silicon nitride film and a silicon oxide film.

8. A method of manufacturing a semiconductor integrated circuit device according to claim 1, wherein the material for constituting the first semiconductor layer and the upper gate electrode is Si or mixed crystals of Si and Ge.

9. A method of manufacturing a semiconductor integrated circuit device comprising the steps of:

preparing a wafer comprising a first semiconductor layer, a second insulative film and a second semiconductor layer, wherein said first semiconductor layer, said second insulative film, and said second semiconductor layer are formed on a support substrate in this order, forming a third insulative film on the main surface of the second semiconductor layer, depositing an ion implantation stopper film on the third insulative film, disposing an opening in the ion implantation stopper film corresponding to a region to be formed the gate electrode, penetrating desired impurity ions in the opening through the third insulative film, the second semiconductor film and the second insulative film thereby forming an impurity diffusion layer comprising impurity at high concentration in the first semiconductor layer, and disposing an upper gate electrode above the main surface of the wafer so as to oppose the impurity diffusion layer.

10. A method of manufacturing a semiconductor integrated circuit device comprising the steps of:

preparing a wafer comprising a first semiconductor layer, a second insulative film and a second semiconductor layer, wherein said first semiconductor layer, said second insulative film, and said second semiconductor layer are formed on a first insulative film disposed on a support substrate in this order, forming a third insulative film on the main surface of the second semiconductor layer, forming an ion implantation stopper film on the third insulative film, forming an opening reaching the first insulative film to a desired portion of a multi-layered film comprising the ion implantation stopper film, the third insulative film, the second semiconductor layer, the second insulative film and the first semiconductor layer, forming an insulation isolative film in the opening by depositing an insulative film in the opening to a thickness higher than that of the multi-layered film and polishing the insulative film to a desired thickness, introducing an impurity at high concentration to at least a portion of the first semiconductor layer in plural regions isolated from each other by the insulation isolation film, and forming an upper gate electrode on the main surface of the wafer so as to oppose the introduction region of the impurity at high concentration.

11. A method of manufacturing a semiconductor integrated circuit device comprising the steps of;

preparing a wafer in which a first semiconductor layer, comprising an amorphous semiconductor or polycrystal semiconductor, a first insulative film and a second semiconductor film are stacked in this order;

forming an impurity layer at high concentration in a region in the first semiconductor by implanting desired impurity ions after preparing the wafer; and disposing an upper gate electrode on the region in the first semiconductor where the impurity layer is formed to form the gate electrode above the main surface of the second semiconductor layer.

12. A method of manufacturing a semiconductor integrated circuit device according to claim 11, wherein the desired impurity ions pass through the second semiconductor layer and the first insulative layer into the first semiconductor layer.

13. A method of manufacturing a semiconductor integrated circuit device according to claim 11, wherein the impurity layer at high concentration is a maximum impurity concentration in the first semiconductor layer.

14. A method of manufacturing a semiconductor integrated circuit device according to claim 13, wherein the maximum impurity concentration in the first semiconductor layer is $1 \times 10^{20}/cm^3$ or more.

15. A method of manufacturing a semiconductor integrated circuit device according to claim 11, wherein the second semiconductor layer comprises a film of any one of a single crystal Si film, single crystal SiGe film or a stacked film comprising a single crystal Si film and single crystal SiGe film.

16. A method of manufacturing a semiconductor integrated circuit device according to claim 11, wherein the first insulative film is a stacked film.

17. A method of manufacturing a semiconductor integrated circuit device according to claim 9, wherein the impurity ions are As or Sb.

18. A method of manufacturing a semiconductor integrated circuit device according to claim 17, wherein the method comprises a step of implanting the impurity of In, F or H to the first semiconductor layer in which impurity of As or Sb has been implanted.

19. A method of manufacturing a semiconductor integrated circuit device according to claim 9, wherein the maximum impurity concentration in the first semiconductor layer is $1 \times 10^{20}/cm^3$ or more.

20. A method of manufacturing a semiconductor integrated circuit device according to claim 9, wherein the method comprises a step of applying an impurity implantation step and a heat treatment step repetitively to the first semiconductor layer in that the cumulative implanted impurity in the first semiconductor layer is $1 \times 10^{15}/cm^2$ or more.

21. A method of manufacturing a semiconductor integrated circuit device according to claim 9, wherein the second semiconductor layer is comprised of a single crystal Si film, a single crystal SiGe film or a stacked film of a single crystal Si film and a single crystal SiGe film.

22. A method of manufacturing a semiconductor integrated circuit device according to claim 9, wherein the second insulative film is comprised of a silicon nitride film or a stacked film of a silicon nitride film and a silicon oxide film.

23. A method of manufacturing a semiconductor integrated circuit device according to claim 9, wherein the material for constituting the first semiconductor layer and the upper gate electrode is Si or mixed crystals of Si and Ge.

* * * * *